(12) United States Patent
Tanaka

(10) Patent No.: US 10,749,024 B2
(45) Date of Patent: Aug. 18, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Akihiro Tanaka, Himeji Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 68 days.

(21) Appl. No.: 16/110,332

(22) Filed: Aug. 23, 2018

(65) Prior Publication Data

US 2019/0296148 A1 Sep. 26, 2019

(30) Foreign Application Priority Data

Mar. 21, 2018 (JP) .................................. 2018-053682

(51) Int. Cl.
*H01L 29/78* (2006.01)
*H01L 27/02* (2006.01)
(Continued)

(52) U.S. Cl.
CPC ...... *H01L 29/7813* (2013.01); *H01L 27/0207* (2013.01); *H01L 27/088* (2013.01);
(Continued)

(58) Field of Classification Search
CPC ............... H01L 29/423; H01L 29/0696; H01L 29/7813; H01L 29/41741; H01L 29/4236;
(Continued)

(56) References Cited

U.S. PATENT DOCUMENTS 7,394,135 B1 * 7/2008 Herbert ............... H01L 29/0856
257/368
8,450,810 B2 * 5/2013 Takeda ............... H01L 29/7825
257/397

(Continued)

FOREIGN PATENT DOCUMENTS

| JP | H04-177879 A | 6/1992 |
|---|---|---|
| JP | 2012-033552 A | 2/2012 |
| JP | 5066928 B2 | 11/2012 |

*Primary Examiner* — Zandra V Smith
*Assistant Examiner* — Jeremy J Joy
(74) *Attorney, Agent, or Firm* — White & Case LLP

(57) ABSTRACT

A semiconductor device of an embodiment includes a first region including a first portion of a semiconductor layer having first and second planes, a first trench, a first gate electrode, a first source electrode and a drain electrode; a second region adjacent to the first region in a first direction and including a second portion of the semiconductor layer, a second trench, a second gate electrode, a second source electrode on the first plane side, and the drain electrode; a third region adjacent to the first region in a second direction crossing the first direction and including a third portion of the semiconductor layer, a third trench, a third gate electrode, a third source electrode on the first plane side, and the drain electrode; a first gate electrode pad connected to the first gate electrode; and a second gate electrode pad connected to the second and third gate electrodes.

12 Claims, 12 Drawing Sheets

(51) Int. Cl.
*H01L 27/088* (2006.01)
*H01L 29/423* (2006.01)
*H01L 29/417* (2006.01)
*H01L 29/06* (2006.01)
*H01L 23/482* (2006.01)

(52) U.S. Cl.
CPC .... *H01L 29/0696* (2013.01); *H01L 29/41741* (2013.01); *H01L 29/4236* (2013.01); *H01L 29/4238* (2013.01)

(58) Field of Classification Search
CPC ............... H01L 27/0207; H01L 27/088; H01L 23/4824
See application file for complete search history.

(56) References Cited

U.S. PATENT DOCUMENTS

| | | | | |
|---|---|---|---|---|
| 2001/0045635 | A1* | 11/2001 | Kinzer | H01L 29/7809 257/685 |
| 2005/0179081 | A1* | 8/2005 | Kitamura | H01L 29/7827 257/329 |
| 2006/0118811 | A1* | 6/2006 | Zheng | H01L 27/088 257/107 |
| 2013/0320454 | A1* | 12/2013 | Suzuki | H01L 27/088 257/368 |
| 2015/0129958 | A1* | 5/2015 | Nita | H01L 21/82347 257/334 |
| 2016/0035721 | A1* | 2/2016 | Takenaka | H01L 23/4824 257/334 |
| 2017/0338337 | A1* | 11/2017 | Bobde | H01L 29/7848 |
| 2018/0096991 | A1* | 4/2018 | Nasu | H01L 23/5226 |

* cited by examiner

SEMICONDUCTOR DEVICE

This application is based upon and claims the benefit of priority from Japanese Patent Application No. 2018-053682, filed on Mar. 21, 2018, the entire contents of which are incorporated herein by reference.

FIELD

Embodiments described herein relate generally to a semiconductor device.

BACKGROUND

For example, a bidirectional switching device, which controls a charging current and a discharging current whose directions are diametrically opposite to each other is required in order to control a charge/discharge state of a secondary battery. For example, it is possible to use two metal insulator field effect transistors (MISFET) in which drain electrodes are connected to each other in the bidirectional switching device. There is a bidirectional switching device in which two trench gate type MISFETs are integrated into one chip in order for downsizing. Reduction in on-resistance is required in order to improve performance of the bidirectional switching device downsized through the integration into one chip.

DETAILED DESCRIPTION

First Embodiment

A semiconductor device according to a first embodiment includes a first region including a first portion of a semiconductor layer having a first plane and a second plane, a first trench provided in the first portion, a first gate electrode provided in the first trench, a first source electrode provided on a first plane side of the first portion, and a drain electrode provided on a second plane side of the first portion; a second region provided to be adjacent to the first region in a first direction and including a second portion of the semiconductor layer, a second trench provided in the second portion, a second gate electrode provided in the second trench, a second source electrode provided on the first plane side of the second portion, and the drain electrode provided on the second plane side of the second portion; a third region provided to be adjacent, to the first region in a second direction crossing the first, direction and including a third portion of the semiconductor layer, a third trench provided in the third portion, a third gate electrode provided in the third trench, a third source electrode provided on the first plane side of the third portion, and the drain electrode provided on the second plane side of the third portion; a first gate electrode pad electrically connected to the first gate electrode; and a second gate electrode pad electrically connected to the second gate electrode and the third gate electrode.

Figure 1:
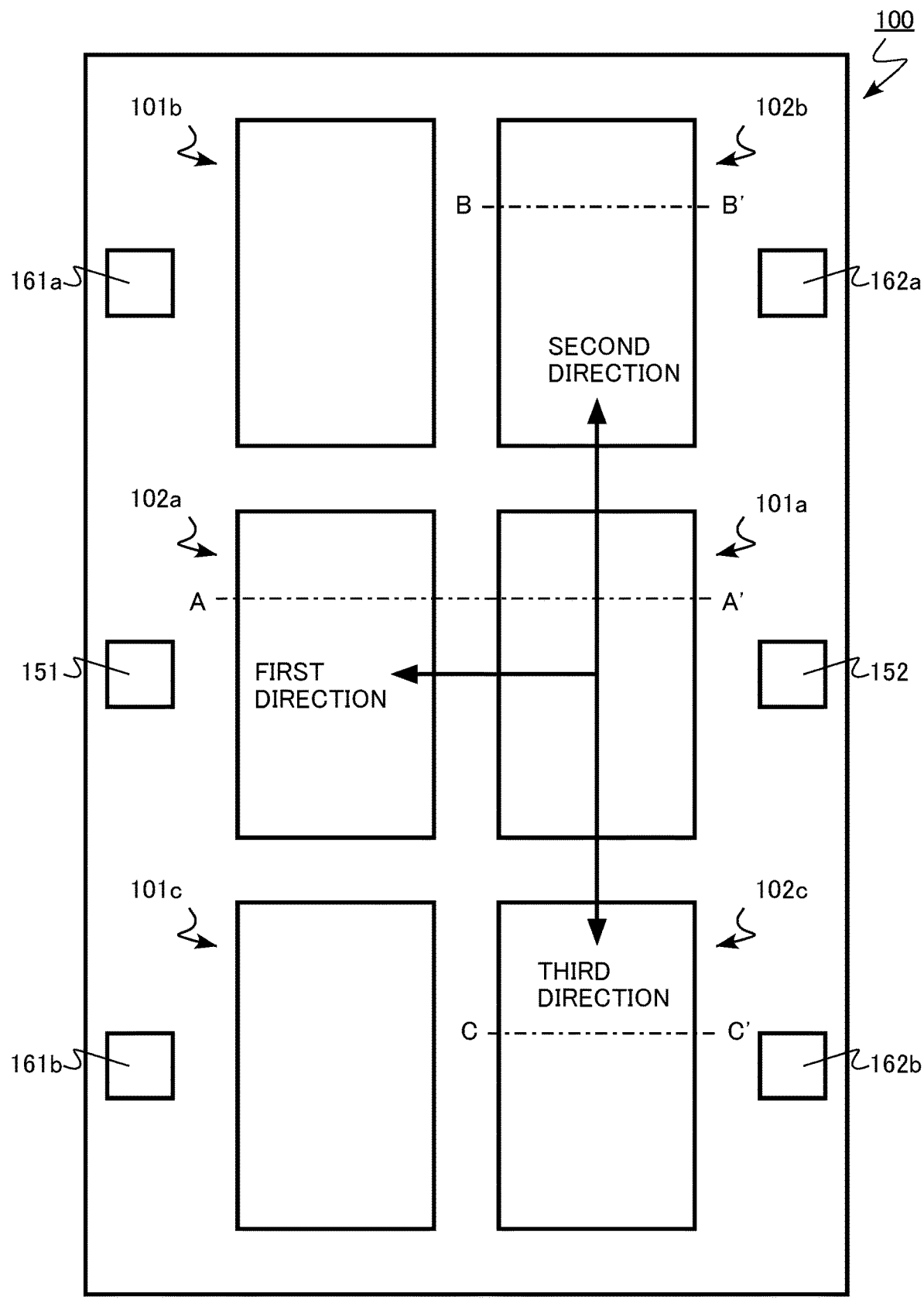
FIG. 1 is a layout diagram of a semiconductor device according to a first embodiment.
Figure 2:
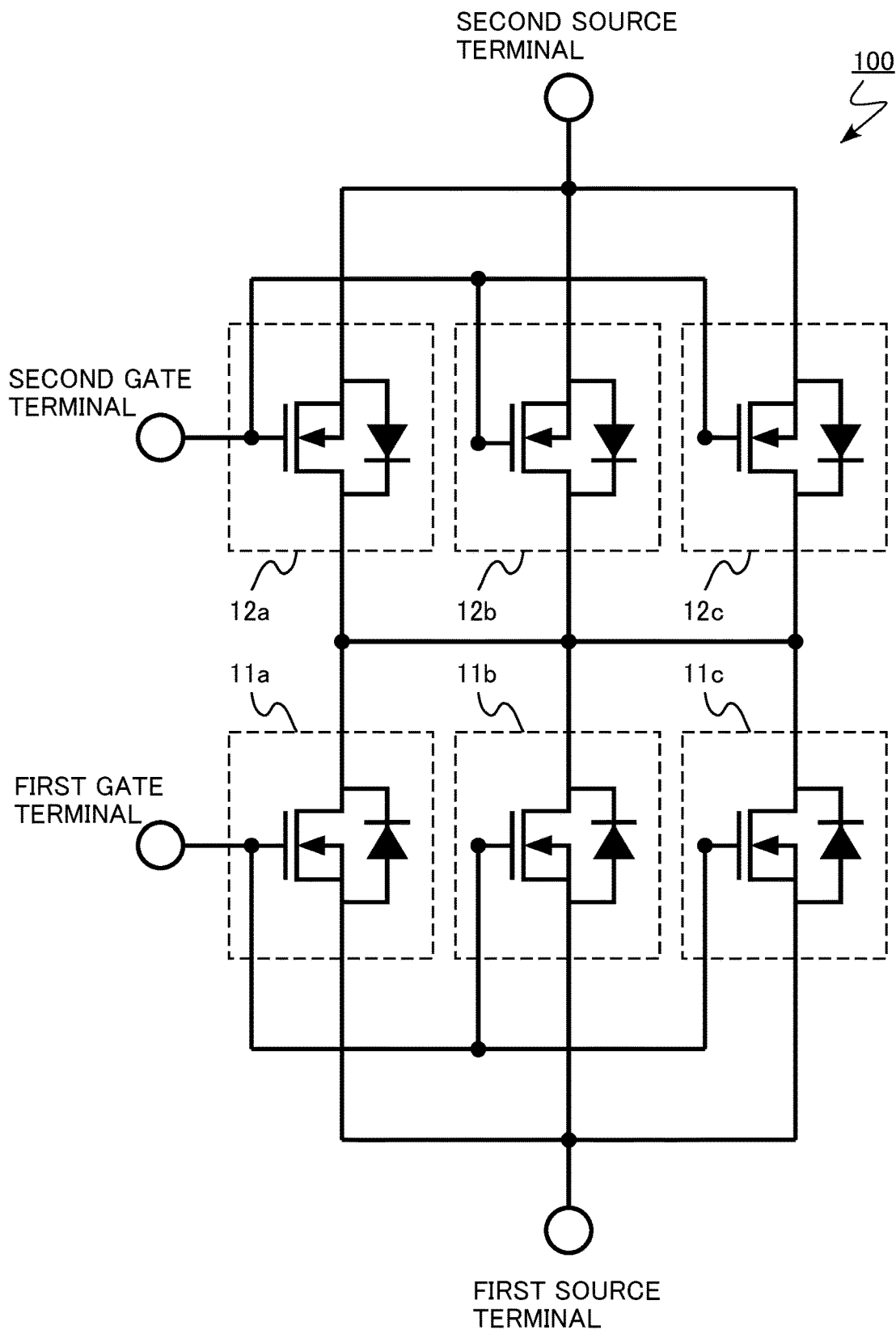
FIG. 2 is an equivalent circuit diagram of the semiconductor device according to the first embodiment.

FIG. 1 is a layout diagram of the semiconductor device according to the first embodiment. FIG. 2 is an equivalent circuit diagram of the semiconductor device according to the first embodiment.

The semiconductor device of the first embodiment is a bidirectional switching device 100. The bidirectional switching device 100 has a structure in which two trench gate type MISFETs are connected so as to have a common drain electrode. The bidirectional switching device 100 is a bidirectional switching device in which the two trench gate type MISFETs are integrated into one chip. The MISFET of the first embodiment is an n-channel MISFET using electrons as carriers.

The bidirectional switching device 100 includes three first transistor regions. That is, the bidirectional switching device 100 includes a first transistor region 101a (first region), a first transistor region 101b, and a first transistor region 101c.

The first transistor region 101a has a first transistor 11a. The first transistor region 101b has a first transistor 11b. The first transistor region 101c has a first transistor 11c.

The bidirectional switching device 100 includes three second transistor regions. That is, the bidirectional switching device 100 includes a second transistor region 102a (second region), a second transistor region 102b (third region), and a second transistor region 102c (fourth region).

The second transistor region 102a has a second transistor 12a. The second transistor region 102b has a second transistor 12b. The second transistor region 102c has a second transistor 12c.

The three first transistor regions and the three second transistor regions are disposed so as to have a so-called checkered pattern. The total area of the three first transistor regions and the total area of the three second transistor regions are substantially the same.

For example, the second transistor region 102a is provided to be adjacent to the first transistor region 101a in the first direction. In addition, the second transistor region 102b is provided to be adjacent to the first transistor region 101a in the second direction. In addition, the second transistor region 102c is provided to be adjacent to the first transistor region 101a in a third direction.

The first direction and the second direction cross each other. For example, the first direction and the second direction are orthogonal to each other. The third direction is different from the first direction and the second direction. For example, the first direction and the third direction are orthogonal to each other.

Incidentally, the first direction is a direction connecting a geometrical center of gravity of the first transistor region 101a and a geometric center of gravity of the second transistor region 102a. In addition, the second direction is a direction connecting the geometrical center of gravity of the first transistor region 101a and a geometric center of gravity of the second transistor region 102b. In addition, the third direction is a direction connecting the geometrical center of gravity of the first transistor region 101a and a geometric center of gravity of the second transistor region 102c. When the transistor region is a quadrangle, the geometric center of gravity is an intersection point of diagonals of the quadrangle.

A geometric shape of the first transistor region is represented by a figure circumscribing a trench that functions as a gate electrode of a transistor in the first transistor region, for example. A geometric shape of the second transistor region is represented by a figure circumscribing a trench that functions as a gate electrode of a transistor in the second transistor region, for example.

The bidirectional switching device 100 includes a first gate electrode pad 151 and a second gate electrode pad 152. In addition, the bidirectional switching device 100 includes two first source electrode pads. That is, the bidirectional switching device 100 includes a first source electrode pad 161a and a first source electrode pad 161b. In addition, the bidirectional switching device 100 includes two second source electrode pads. That is, the bidirectional switching device 100 includes a second source electrode pad 162a and a second source electrode pad 162b.

As illustrated in FIG. 2, the bidirectional switching device 100 includes a first gate terminal, a second gate terminal, a first source terminal, and a second source terminal. The first gate terminal corresponds to the first gate electrode pad 151. The second gate terminal corresponds to the second gate electrode pad 152. The first source terminal corresponds to the first source electrode pad 161a and the first source electrode pad 161b. The second source terminal corresponds to the second source electrode pad 162a and the second source electrode pad 162b. As illustrated in FIG. 2, the first transistor 11a, the first transistor 11b, and the first transistor 11c are connected in parallel. Gate electrodes of the first transistor 11a, the first transistor 11b, and the first transistor 11c are connected to the first gate terminal. Source electrodes of the first transistor 11a, the first transistor 11b, and the first transistor 11c are connected to the first source terminal.

The second transistor 12a, the second transistor 12b, and the second transistor 12c are connected in parallel. Gate electrodes of the second transistor 12a, the second transistor 12b, and the second transistor 12c are connected to the second gate terminal. Source electrodes of the second transistor 12a, the second transistor 12b, and the second transistor 12c are connected to the second source terminal.

Drain electrodes of the first transistor 11a, the first transistor 11b, and the first transistor 11c are connected to drain electrodes of the second transistor 12a, the second transistor 12b, and the second transistor 12c.

Each of the first transistor 11a, the first transistor 11b, the first transistor 11c, the second transistor 12a, the second transistor 12b, and the second transistor 12c has a built-in body diode.

Figure 3:
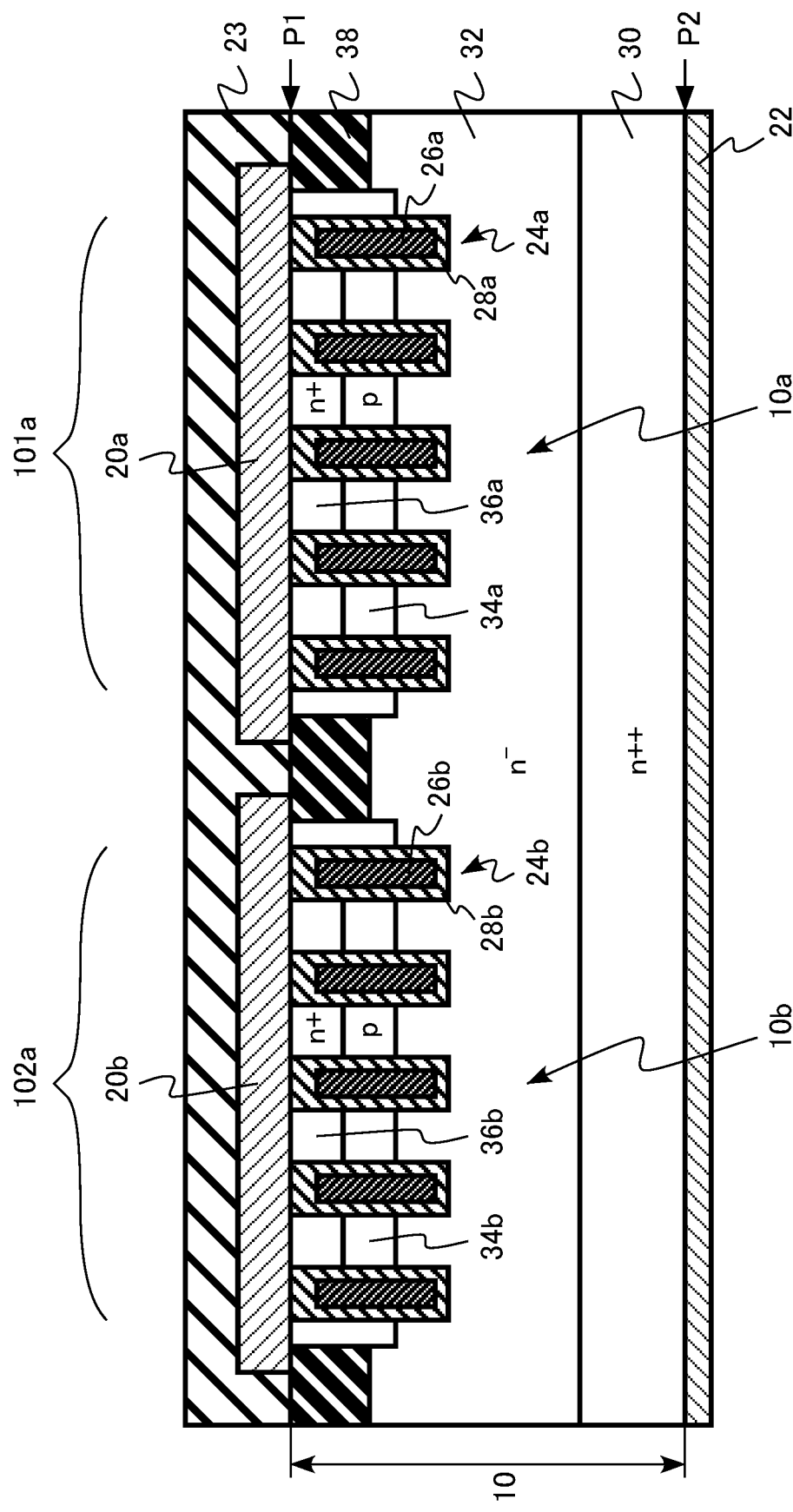
FIG. 3 is a schematic cross-sectional view of the semiconductor device according to the first embodiment.
Figure 4A:
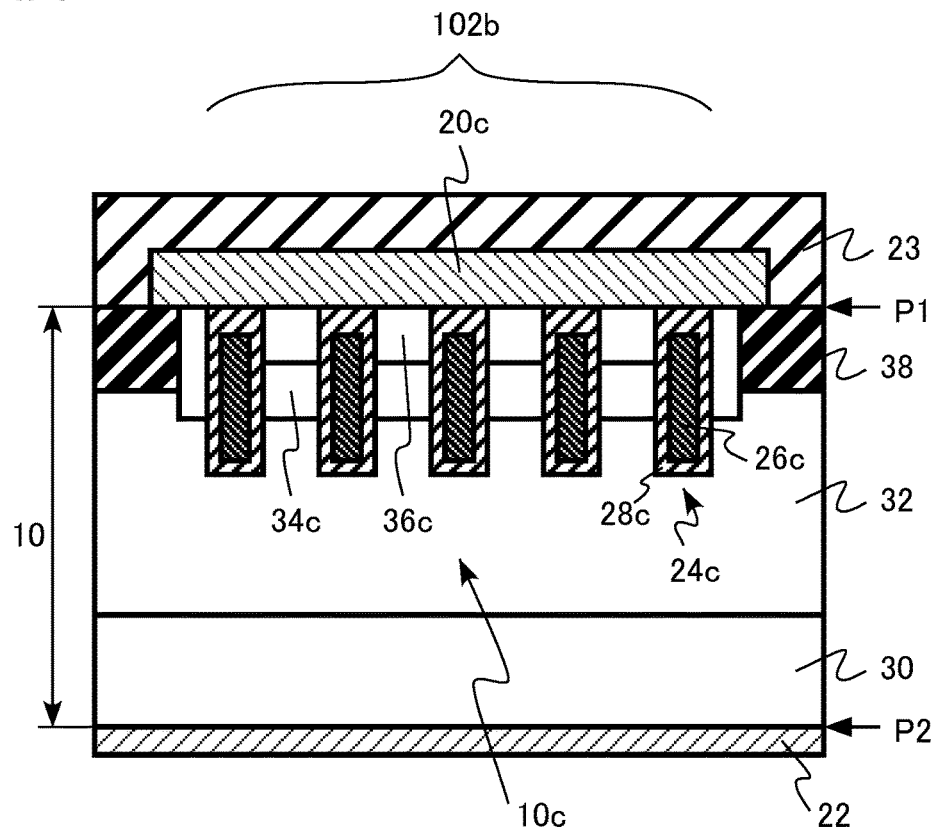
FIGS. 4A and 4B are schematic cross-sectional views of the semiconductor device according to the first embodiment.
Figure 4B:
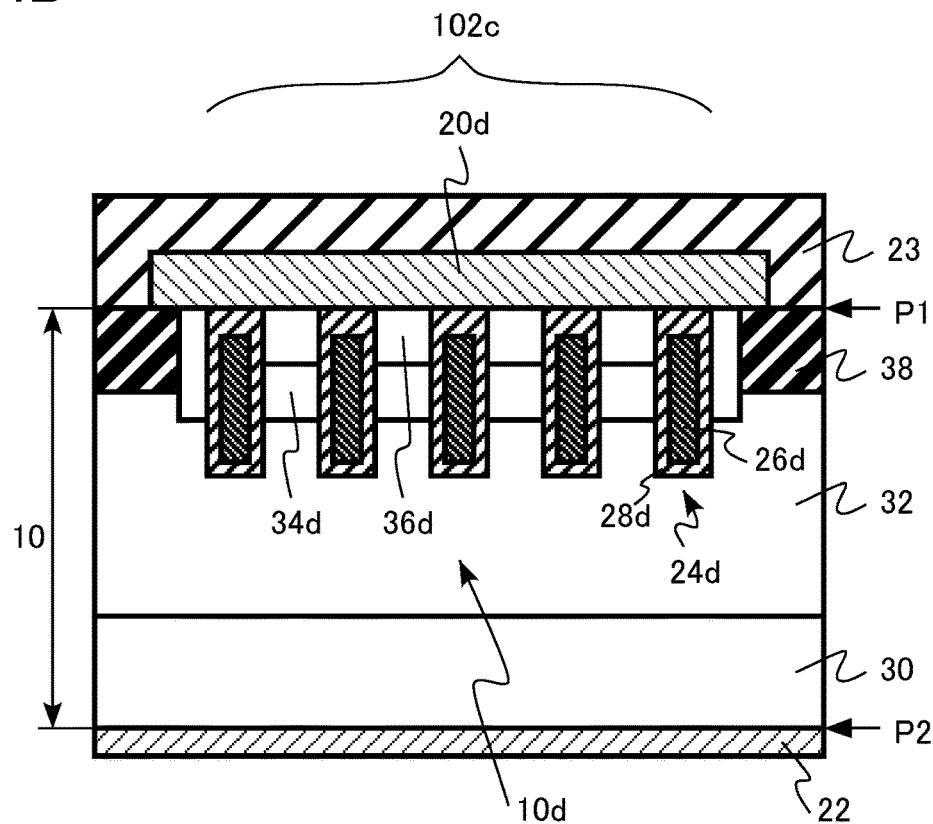

FIGS. 3, 4A, and 4B are schematic cross-sectional views of the semiconductor device according to the first embodiment. FIG. 3 is a cross section taken along a line AA' of FIG. 1. FIG. 4A is a cross-sectional view taken along a line BB' of FIG. 1, and FIG. 4B is a cross-sectional view taken along a line CC' of FIG. 1.

The bidirectional switching device 100 includes a semiconductor layer 10, a first source electrode 20a, a second source electrode 20b, a third source electrode 20c, a fourth source electrode 20d, a drain electrode 22, and a protective film 23. The semiconductor layer 10 has a first portion 10a, a second portion 10b, a third portion 10c, and a fourth portion 10d. The semiconductor layer 10 has a first trench 24a, a second trench 24b, a third trench 24c, a fourth trench 24d, a first gate electrode 26a, a second gate electrode 26b, a third gate electrode 26c, a fourth gate electrode 26d, a first gate insulating film 28a, a second gate insulating film. 28b, a third gate insulating film 28c, a fourth gate insulating film 28d, a drain region 30, a drift region 32, a first base region 34a, a second base region 34b, a third base region 34c, a fourth base region 34d, a first source region 36a, a second source region 36b, a third source region 36c, a fourth source region 36d, and an element isolation region 38.

The semiconductor layer 10 has a first plane (P1 in FIG. 3) and a second plane (P2 in FIG. 3). The first plane P1 is a front surface of the semiconductor layer 10 and the second plane P2 is a back surface of the semiconductor-layer 10.

The semiconductor layer 10 is, for example, a single crystal layer of silicon (Si). The first plane is, for example, a (001) face of silicon.

The drift region 32 is provided on the second plane P2 side of the semiconductor layer 10. The drain region 30 is provided between the drift region 32 and the first plane P2.

The first transistor region 101a includes the first portion 10a of the semiconductor layer 10, and a plurality of the first trenches 24a provided in the first portion 10a of the semiconductor layer 10. The first transistor region 101a includes the first gate electrode 26a and the first gate insulating film 28a provided in the first trench 24a. The first gate electrode 26a is the gate electrode of the first transistor 11a.

The first transistor region 101a includes the first source electrode 20a provided on the first plane P1 side of the first portion 10a of the semiconductor layer 10, and the drain electrode 22 provided on the second plane P2 side of the first portion 10a of the semiconductor layer 10. In addition, the first transistor region 101a includes the drain region 30, the drift region 32, the first base region. 34a, and the first source region 36a provided in the first portion 10a of the semiconductor layer 10.

The first base region 34a is provided between the drift region 32 and the first plane P1. The first source region 36a is provided between the first base region 34a and the first plane P1. The first gate insulating film 28a is provided between the first gate electrode 26a and the first base region 34a.

The second transistor region 102a includes the second portion 10b of the semiconductor layer 10 and a plurality of the second trenches 24b provided in the second portion 10b of the semiconductor layer 10. The second transistor region 102a includes the second gate electrode 26b and the second gate insulating film 28b provided in the second trench 24b. The second gate electrode 26b is the gate electrode of the second transistor 12a.

The second transistor region 102a includes the second source electrode 20b provided on the first plane P1 side of the second portion 10b of the semiconductor layer 10, and the drain electrode 22 provided on the second plane P2 side of the second port 10b of the semiconductor layer 10. In addition, the second transistor region 102a includes the drain region 30, the drift region 32, the second base region 34b, and the second source region 36b provided in the second portion 10b of the semiconductor layer 10.

The second base region 34b is provided between the drift region 32 and the first plane P1. The second source region 36b is provided between the second base region 34b and the first plane P1. The second gate insulating film 28b is provided between the second gate electrode 26b and the second base region 34b.

The second transistor region 102b includes the third portion 10c of the semiconductor layer 10 and a plurality of the third trenches 24c provided in the third portion 10c of the semiconductor layer 10. The second transistor region 102b includes the third gate electrode 26c and the third gate insulating film 28c provided in the third trench 24c. The third gate electrode 26c is the gate electrode of the second transistor 12b.

The second transistor region 102b includes the third source electrode 20c provided on the first plane P1 side of the third portion 10c of the semiconductor layer 10 and the drain electrode 22 provided on the second plane P2 side of the third portion 10c of the semiconductor layer 10. In addition, the second transistor region 102b includes the drain region 30, the drift region 32, the third base region 34c, and the third source region 36c provided in the third portion 10c of the semiconductor layer 10.

The third base region 34c is provided between the drift region 32 and the first plane P1. The third source region 36c is provided between the third base region 34c and the first plane P1. The third gate insulating film 28c is provided between the third gate electrode 26c and the third base region 34c.

The second transistor region 102c includes the fourth portion 10d of the semiconductor layer 10 and a plurality of the fourth trenches 24d provided in the fourth portion 10d of the semiconductor layer 10. The second transistor region 102c includes the fourth gate electrode 26d and the fourth gate insulating film 28d provided in the fourth trench 24d. The fourth gate electrode 26d is the gate electrode of the second transistor 12c.

The second transistor region 102c includes the fourth source electrode 20d provided on the first plane P1 side of the fourth portion 10d of the semiconductor layer 10 and the drain electrode 22 provided on the second plane P2 side of the fourth portion 10d of the semiconductor layer 10. In addition, the second transistor region 102c includes the drain region 30, the drift region 32, the fourth base region 34d, and the fourth source region 36d provided in the fourth portion 10d of the semiconductor layer 10.

The fourth base region 34d is provided between the drift region 32 and the first plane P1. The fourth source region 36d is provided between the fourth base region 34d and the first plane P1. The fourth gate insulating film 28d is provided between the fourth gate electrode 26d and the fourth base region 34d.

The drain region 30 is an impurity region containing n-type impurities. The drift region 32 is an impurity region containing n-type impurities. An n-type impurity concentration of the drift region 32 is lower than an n-type impurity concentration of the drain region 30.

The first base region 34a, the second base region 34b, the third base region 34c, and the fourth base region 34d are impurity regions containing p-type impurities. The first source region 36a, the second source region 36b, the third source region 36c, and the fourth source region 36d are impurity regions containing n-type impurities. Each n-type impurity concentration of the first source region 36a, the second source region 36b, the third source region 36c, and the fourth source region 36d is higher than the n-type impurity concentration of the drift region 32.

The first gate electrode 26a, the second gate electrode 26b, the third gate electrode 26c, and the fourth gate electrode 26d are, for example, polycrystalline silicon containing conductive impurities. The first gate insulating film 28a, the second gate insulating film 28b, the third gate insulating film 28c, and the fourth gate insulating film 28d are, for example, silicon oxide films.

The element isolation region 38 is an insulating layer. The element isolation region 38 is, for example, silicon oxide. In addition, the protective film 23 is an insulating film. The protective film 23 is, for example, polyimide.

Figure 5:
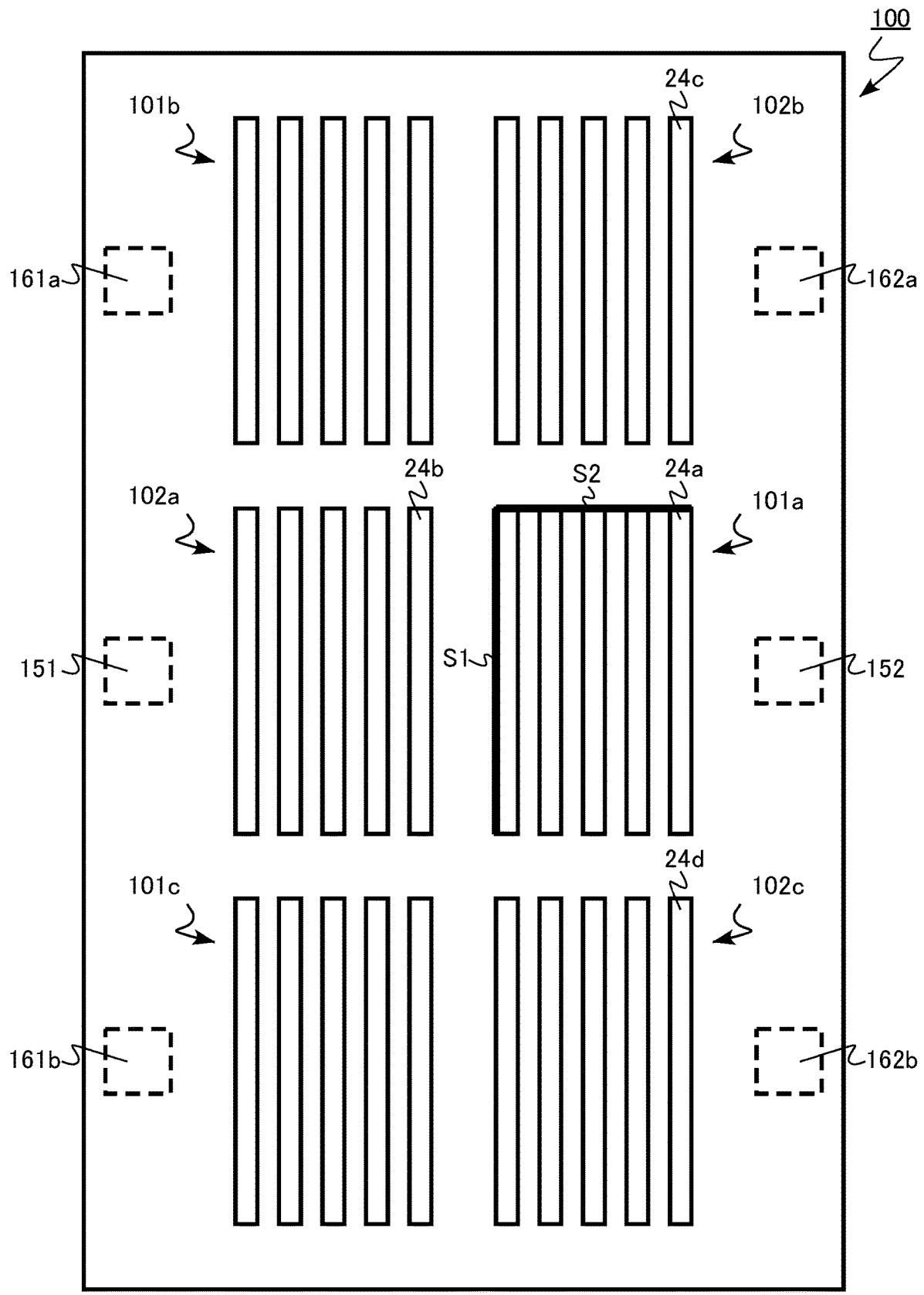
FIG. 5 is a layout diagram of the semiconductor device according to the first embodiment.

FIG. 5 is a layout diagram of the semiconductor device according to the first embodiment. FIG. 5 illustrates a pattern layout of trenches provided in the bidirectional switching device 100.

FIG. 5 also illustrates positions of the first gate electrode pad 151, the second gate electrode pad 152, the first source electrode pad 161a, the first source electrode pad 161b, the second source electrode pad 162a, and the second source electrode pad 162b.

An extending direction of the trench in each transistor region is perpendicular to a short side of each transistor region and is parallel to a long side of each transistor region. For example, an extending direction of the first trench 24a of the first transistor region 101a is perpendicular to a snort side of the first transistor region 101a and is parallel to a long side of the first transistor region 101a.

An angle formed by a longer side between a first side (S1 in FIG. 5) of the first transistor region 101a (first region) on a side opposing the second transistor region 102a (second region) and a second side (S2 in FIG. 5) of the first transistor region 101a on a side opposing the second transistor region 102b (third region) and an extending direction of the first trench 24a is smaller than an angle formed by a shorter side between the first side and the second side and the extending direction of the first trench 24a. The angle formed by the longer first side S1, which is the longer side, and the extending direction of the first trench 24a is 0 (zero) degree and the angle formed by the second side 52, which is the shorter side, and the extending direction of the first trench 24a is 90 degrees.

Figure 6:
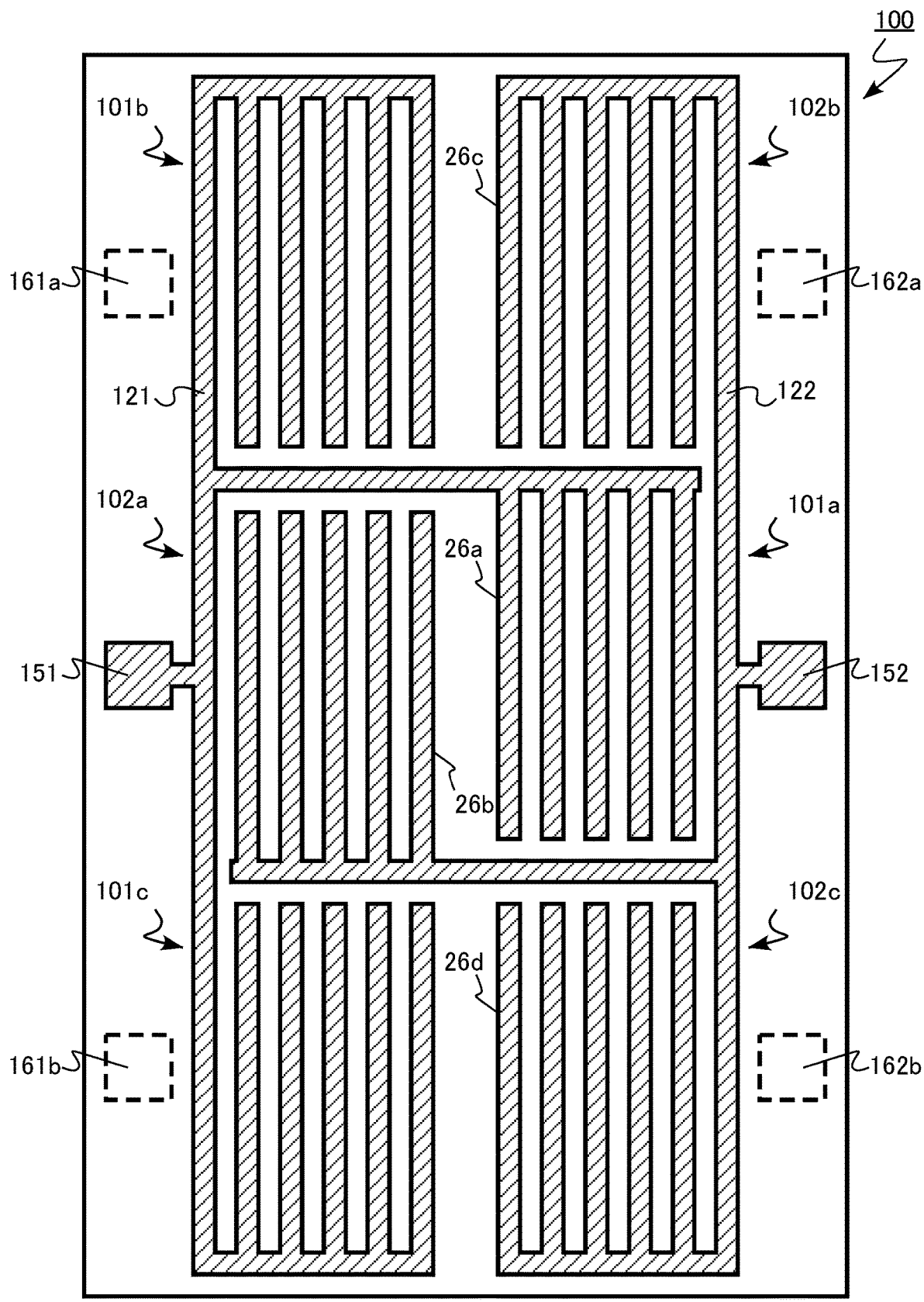
FIG. 6 is a layout diagram of the semiconductor device according to the first embodiment.

FIG. 6 is a layout diagram of the semiconductor device according to the first embodiment. FIG. 6 illustrates a pattern layout of a first gate wiring 121, a second gate wiring 122, the first gate electrode 26a, the second gate electrode 26b, the third gate electrode 26c, and the fourth gate electrode 26d provided in the bidirectional switching device 100.

FIG. 6 also illustrates positions of the first gate electrode pad 151, the second gate electrode pad 152, the first source electrode pad 161a, the first source electrode pad 161b, the second source electrode pad 162a, and the second source electrode pad 162b.

The first gate wiring 121 is connected to the first gate electrode 26a. The second gate wiring 122 is connected to the second gate electrode 26b, the third gate electrode 26c, and the fourth gate electrode 26d.

The first gate wiring 121 is electrically connected to the first gate electrode pad 151 via, for example, a contact hole (not illustrated). The first gate electrode pad 151 is electrically connected to the first gate electrode 26a via the first gate wiring 121.

The second gate wiring 122 is electrically connected to the second gate electrode pad 152 via, for example, a contact hole (not illustrated). The second gate electrode pad 152 is electrically connected to the second gate electrode 26b, the third gate electrode 26c, and the fourth gate electrode 26d via the second gate wiring 122. The second gate electrode 26b, the third gate electrode 26c, and the fourth gate electrode 26d are electrically connected to each other.

For example, the first gate wiring 121 and the second gate wiring 122 are formed using the same material as and simultaneously with the first gate electrode 26a, the second gate electrode 26b, the third gate electrode 26c, and the fourth gate electrode 26d. The first gate wiring 121 and the second gate wiring 122 are, for example, polycrystalline silicon containing conductive impurities.

Figure 7:
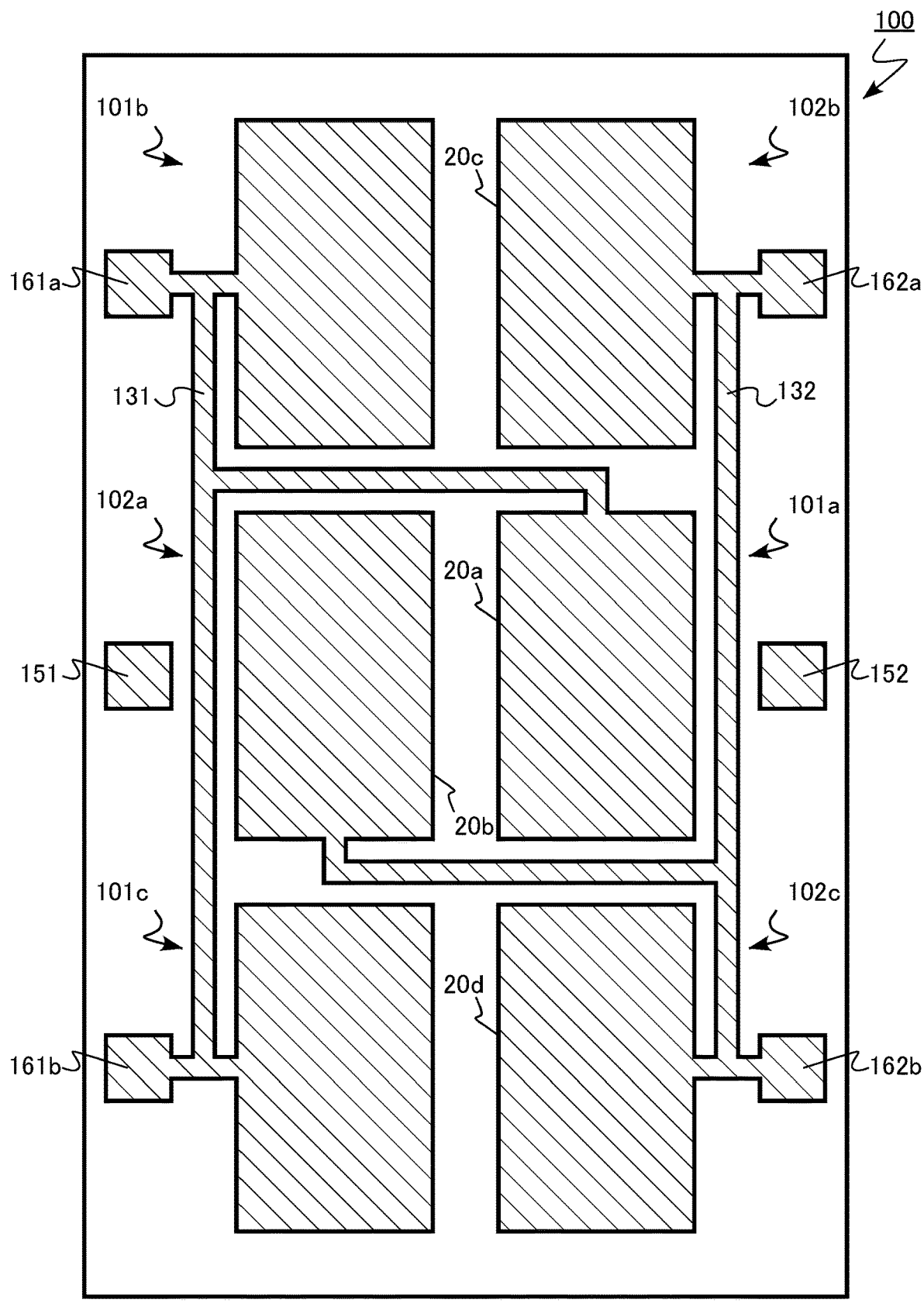
FIG. 7 is a layout diagram of the semiconductor device according to the first embodiment.

FIG. 7 is a layout diagram of the semiconductor device according to the first embodiment FIG. 7 illustrates a pattern layout of a first source wiring 131, a second source wiring 132, the first source electrode 20a, the second source electrode 20b, the third source electrode 20c, and the fourth source electrode 20d provided in the bidirectional switching device 100.

FIG. 7 also illustrates the first gate electrode pad 151, the second gate electrode pad 152, the first source electrode pad 161a, the first source electrode pad 161b, the second source electrode pad 162a, and the second source electrode pad 162b.

The first source wiring 131 is connected to the first source electrode 20a. The second source wiring 132 is connected to the second source electrode 20b, the third source electrode 20c, and the fourth source electrode 20d.

The first source wiring 131 is electrically connected to the first source electrode pad 161a and the first source electrode pad 161b. The first source electrode pad 161a and the first source electrode pad 161b are electrically connected to the first source electrode 20a via the first source wiring 131.

The second source wiring 132 is electrically connected to the second source electrode pad 162a and the second source electrode pad 162b. The second source electrode pad 162a and the second source electrode pad 162b are electrically connected to the second source electrode 20b, the third source electrode 20c, and the fourth source electrode 20d via the second source wiring 132. The second source electrode 20b, the third source electrode 20c, and the fourth source electrode 20d are electrically connected to each other via the second source wiring 132.

For example, the first source wiring 131 and the second source wiring 132 are formed using the same material as and formed simultaneously with the first source electrode 20a, the second source electrode 20b, the third source electrode 20c, and the fourth source electrode 20d. The first source wiring 131 and the second source wiring 132 are, for example, metal containing aluminum.

Next, a function and an effect of the semiconductor device of the first embodiment will be described.

In the bidirectional switching device in which the two trench gate type MISFETs are integrated into one chip, reduction in on-resistance is required in order to improve performance of the device.

Figure 8:
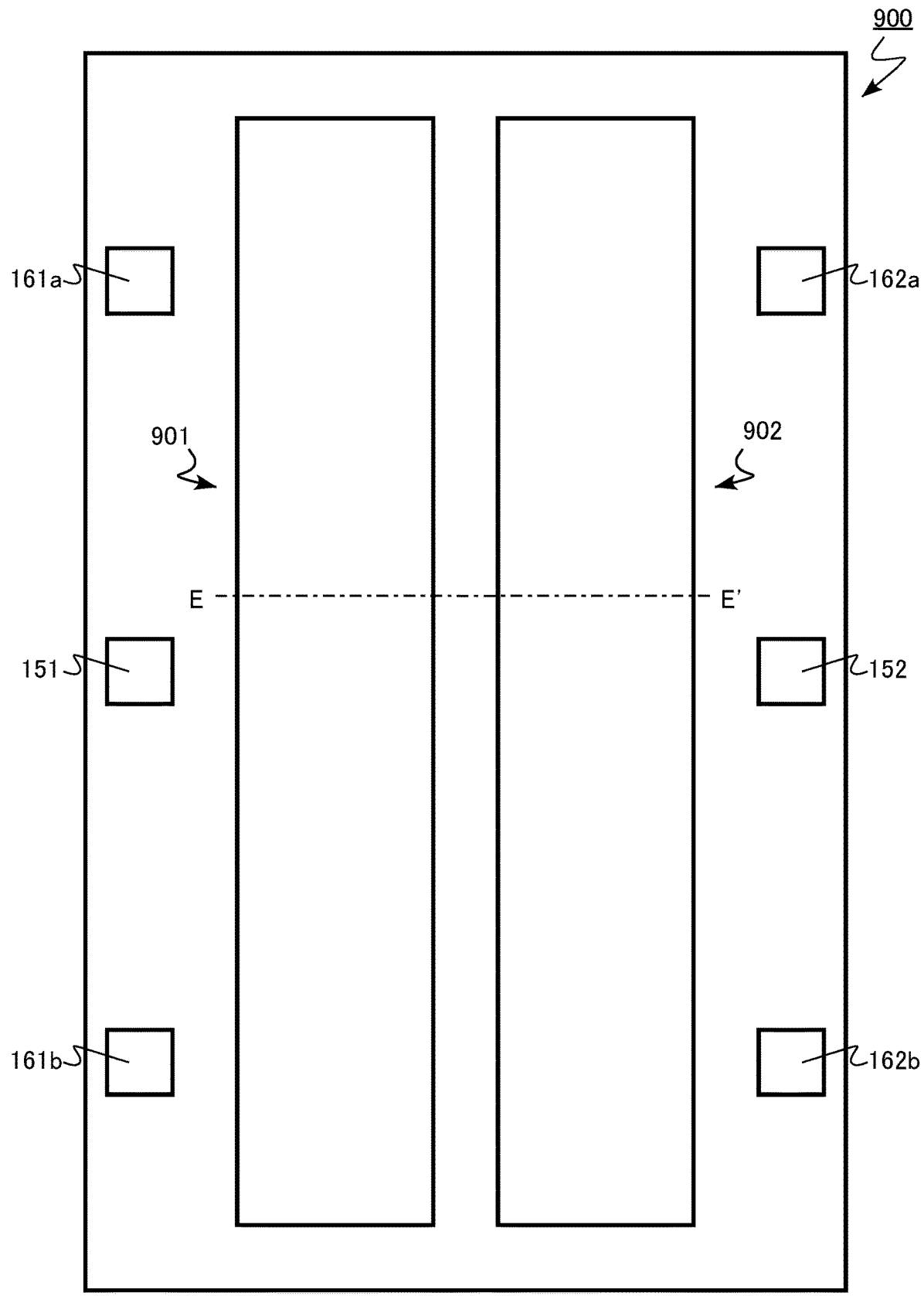
FIG. 8 is a layout diagram of a semiconductor device according to a comparative example.

FIG. 8 is a layout diagram of a semiconductor device according to a comparative example. The semiconductor device of the comparative embodiment is a bidirectional switching device 900. The bidirectional switching device 900 is a bidirectional switching device in which the two trench gate type MISFETs are integrated into one chip.

The bidirectional switching device 900 includes a first transistor region 901 and a second transistor region 902.

The bidirectional switching device 900 includes a first gate electrode pad 151 and a second gate electrode pad 152. In addition, the bidirectional switching device 900 includes two first source electrode pads. That is, the bidirectional switching device 100 includes a first source electrode pad 161a and a first source electrode pad 161b. In addition, the bidirectional switching device 900 includes two second source electrode pads. That is, the bidirectional switching device 100 includes a second source electrode pad 162a and a second source electrode pad 162b.

The bidirectional switching device 900 is different from the bidirectional switching device 100 of the first embodiment in terms that the number of each of the first transistor region and the second transistor region is one.

Figure 9:
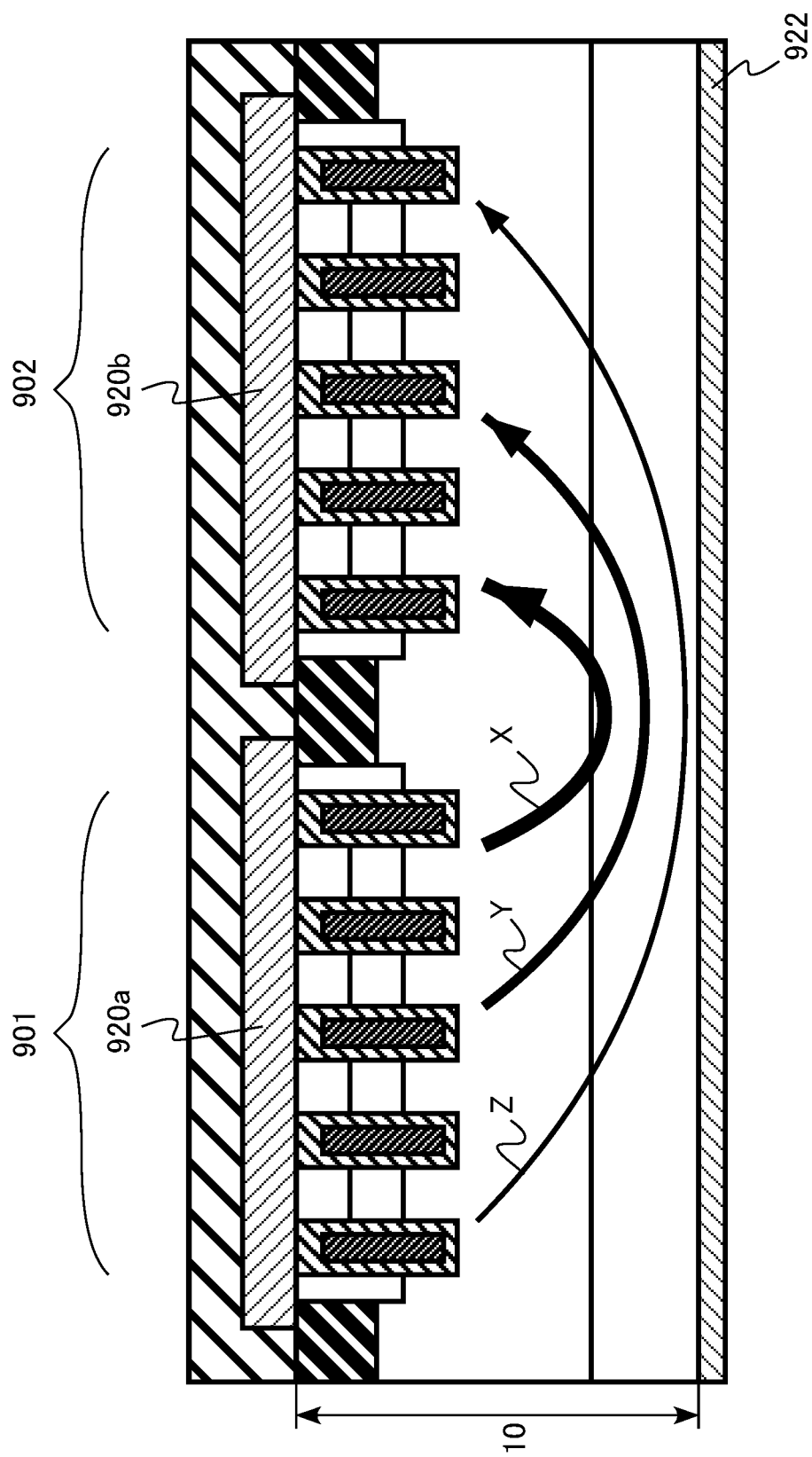
FIG. 9 is a schematic cross-sectional view of the semiconductor device according to the comparative example.

FIG. 9 is a schematic cross-sectional view of the semiconductor device according to the comparative example. FIG. 9 is a cross section taken along a line EE' of FIG. 8. A structure of the cross section along the line EE' is similar to the structure of the cross section along the line AA' in the first embodiment illustrated in FIG. 3.

The bidirectional switching device 900 includes a semiconductor layer 10, a first source electrode 920a, a second source electrode 920b, and a drain electrode 922.

For example, it is assumed that an on-current flows from the first source electrode 920a of the first transistor region 901 toward the second source electrode 920b of the second transistor region 902. The on-current flows through the semiconductor layer 10 or the drain electrode 922.

A large current flows in a current path K near a boundary between the first transistor region 901 and the second transistor region 902 since an electrical resistance becomes low. On the other hand, the flowing current decreases in a current path Y and a current path Z where the electrical resistance increases.

For example, it is conceivable to thicken the drain electrode 922 to lower an electrical resistance of the drain electrode 922 in order to lower the electrical resistance in the current path Y and the current path Z. However, the thickening the drain electrode 922 makes it difficult to perform dicing at the time of dividing the chip into individual pieces, and there is a risk that chipping and cracks may occur in the semiconductor layer 10. In addition, the thickening of the drain electrode 922 leads to an increase in manufacturing cost.

In the bidirectional switching device 100 of the first embodiment, each of the first transistor region and the second transistor region is divided into three portions. Further, the divided first transistor regions and the divided second transistor regions are disposed so as to have a checkered pattern.

Therefore, in the bidirectional switching device 100 of the first embodiment, the sum of lengths of boundary regions between the first transistor regions and the second transistor regions is larger than the sum of lengths of boundary regions in the bidirectional switching device 900 of the comparative example.

Here, the boundary region is a region sandwiched between the first transistor region and the second transistor region. Further, the length of the boundary region is the length of the boundary region in a direction perpendicular to a direction connecting the first transistor region and the second transistor region. For example, each of the first side S1 and the second side S2 corresponds to the length of the boundary region in FIG. 5.

Therefore, a proportion of the current path X having the low electrical resistance accounting for the entire current path illustrated in FIG. 9 is large. Accordingly, the on-current of the bidirectional switching device 100 increases. In other words, the on-resistance of the bidirectional switching device 100 is reduced.

As described above, it is possible to realize the bidirectional switching device 100 capable of reducing the on-resistance according to the first embodiment.

Second Embodiment

A semiconductor device according to a second embodiment is different from that of the first embodiment in terms that an angle formed by a longer side between a first side of a first region on a side opposing a second region and a second side of the first region on a side opposing a third region, and an extending direction of a first trench is larger than an angle formed by a shorter side between the first side and the second side and the extending direction of the first trench. Hereinafter, some of the content overlapping with that in the first embodiment will not be described.

The semiconductor device of the second embodiment is a bidirectional switching device 200.

Figure 10:
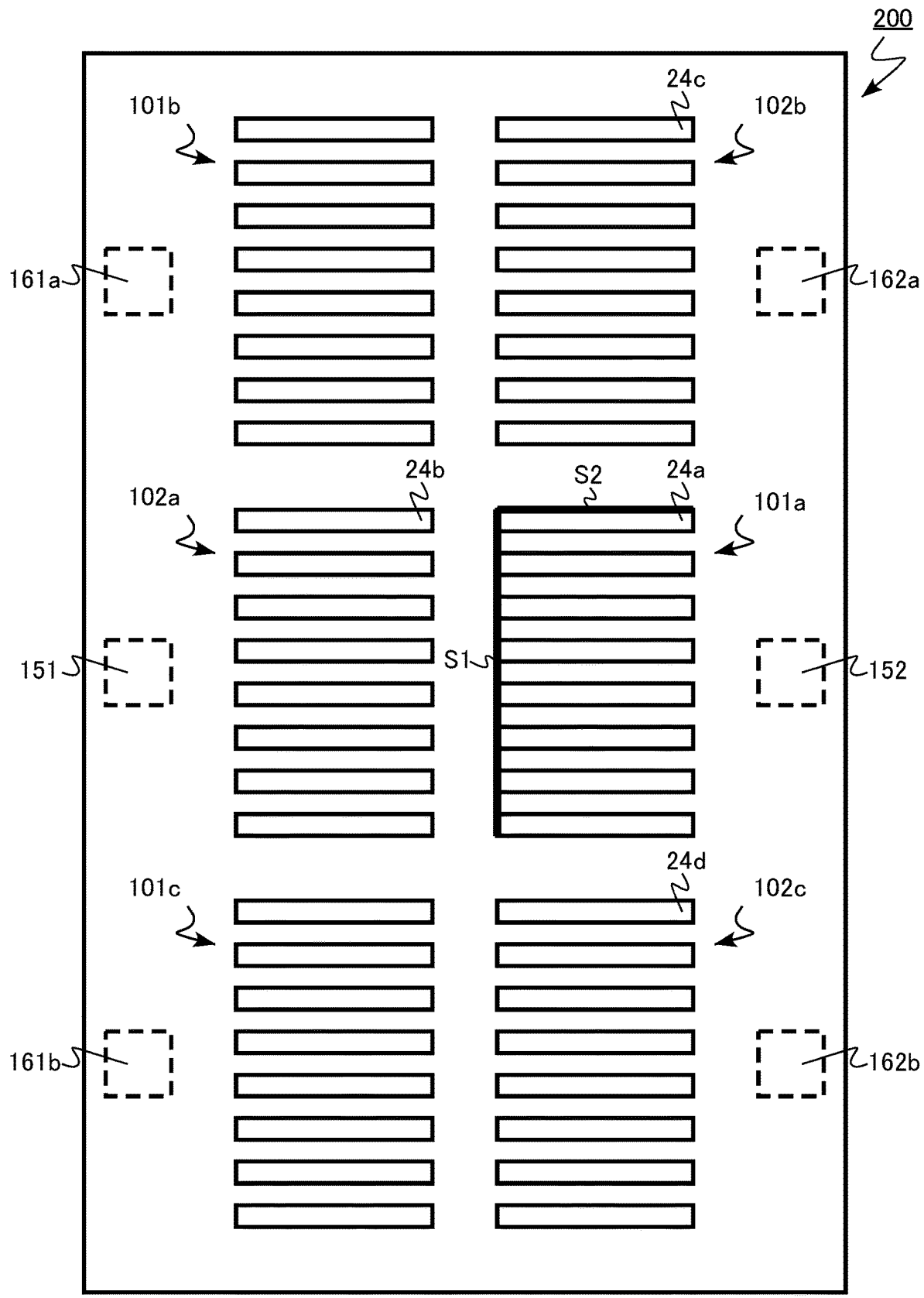
FIG. 10 is a layout diagram of a semiconductor device according to a second embodiment.

FIG. 10 is a layout diagram of the semiconductor device according to the second embodiment. FIG. 10 illustrates a pattern layout of trenches provided in the bidirectional switching device 200.

FIG. 10 also illustrates positions of a first gate electrode pad 151, a second gate electrode pad 152, a first source electrode pad 161a, a first source electrode pad 161b, a second source electrode pad 162a, and a second source electrode pad 162b.

An extending direction of a trench in each transistor region is parallel to a short side of each transistor region and is perpendicular to a long side of each transistor region. For example, an extending direction of a first trench 24a of a first transistor region 101a is parallel to a short side of the first transistor region 101a and is perpendicular to a long side of the first transistor region 101a.

An angle formed by a longer side between a first side (S1 in FIG. 10) of the first transistor region 101a (first region) on a side opposing a second transistor region 102a (second region) and a second side (S2 in FIG. 10) of the first transistor region 101a on a side opposing a second transistor region 102b (third region) and the extending direction of the first trench 24a is larger than an angle formed by a shorter side between the first side and the second side and the extending direction of the first trench 24a. The angle formed by the longer first side S1, which is the longer side, and the extending direction of the first trench 24a is 90 degrees, and the angle formed by the second side S2, which is the shorter side, and the extending direction of the first trench 24a is 0 degree.

For example, when a current flows between the first transistor region 101a and the second transistor region 102a, the current flows along the extending direction of the first trench 24a. Thus, a drift region 32 sandwiched 2a between the two first trenches 24a functions as a current path.

On the other hand, when a current flows between the first transistor region 101a and the second transistor region 102b, the current flows in a direction orthogonal to the extending direction of the first trench 24a. Thus, the drift region 32 sandwiched between the two first trenches 24a no longer functions as the current path.

If lengths of boundary regions are the same, it is possible to cause a larger current to flow by causing the current to flow along the extending direction of the first trench 24a. The length of the boundary region is, for example, a length of the first side 51 or a second side S2 in FIGS. 5 and 10. In the bidirectional switching device 200, the first side Si is longer than the second side S2.

Therefore, the length (S1) of the boundary region in which the current flows along the extending direction of the first trench 24a is longer than the length (S2) of the boundary region in which the current flows in the direction orthogonal to the extending direction of the first trench 24a.

Accordingly, an on-current of the bidirectional switching device 200 is larger than the on-current of the bidirectional switching device 100 of the first embodiment. In other words, the on-resistance of the bidirectional switching device 200 is reduced.

As described above, it is possible to realize the bidirectional switching device 200 capable of further reducing the on-resistance according to the second embodiment.

Third Embodiment

A semiconductor device according to a third embodiment is different from that of the first embodiment in terms that an angle between a first side of a first region opposing a second region and a second side of the first region opposing a third region is smaller than 90 degrees. Hereinafter, some of the content overlapping with that in the first embodiment will not be described.

The semiconductor device of the third embodiment is a bidirectional switching device 300.

Figure 11:
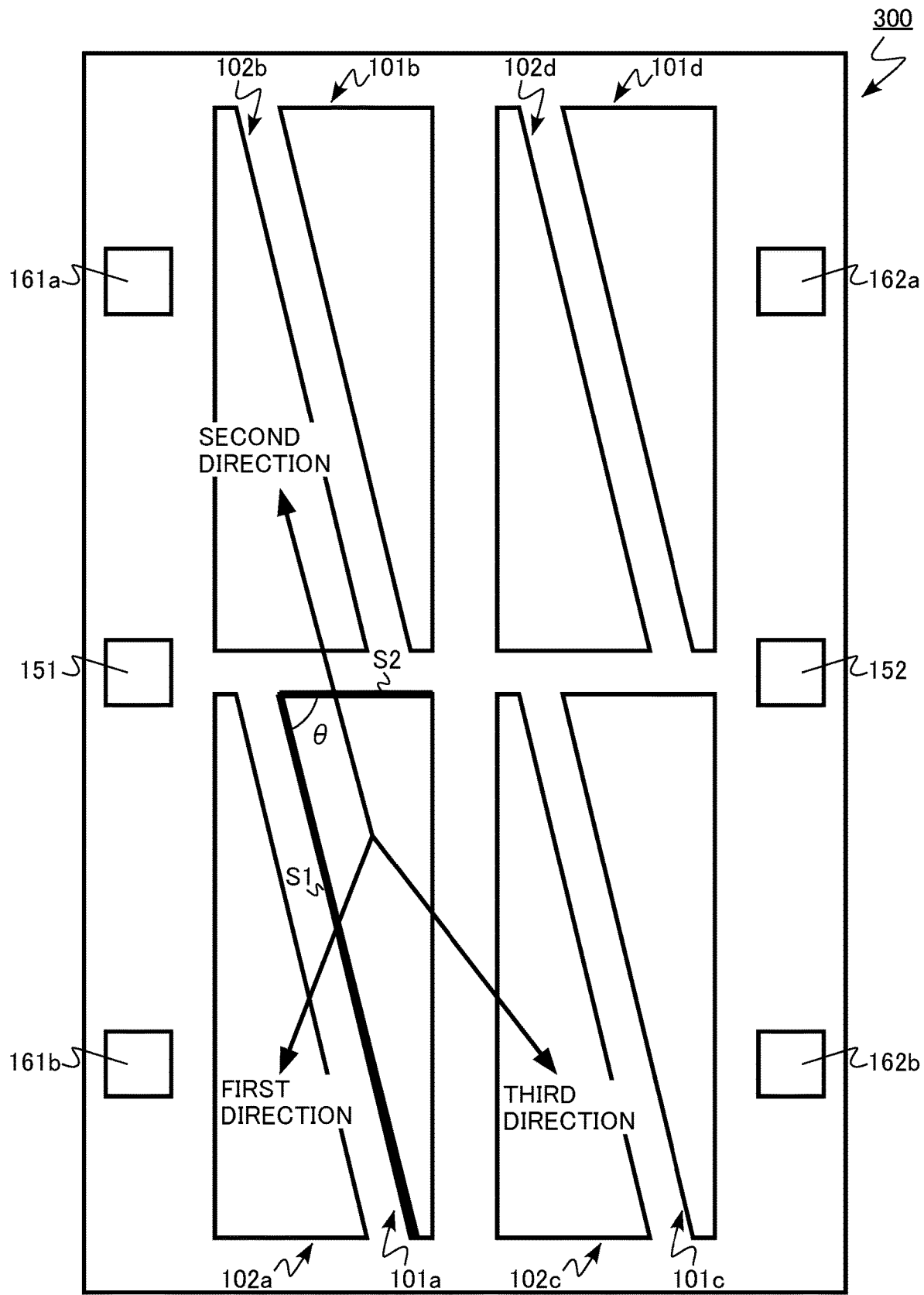
FIG. 11 is a layout diagram of a semiconductor device according to a third embodiment.

FIG. 11 is a layout diagram of the semiconductor device according to the third embodiment.

The bidirectional switching device 300 includes four first transistor regions. That is, the bidirectional switching device 300 includes a first transistor region 101a (first region), a first transistor region 101b, a first transistor region 101c, and a first transistor region 101d.

The bidirectional switching device 300 includes four second transistor regions. That is, the bidirectional switching device 300 includes a second transistor region 102a (second region), a second transistor region 102b (third region), a second transistor region 102c (fourth region), and a second transistor region 102d.

For example, the second transistor region 102a is provided to be adjacent to the first transistor region 101a in a first direction. In addition, the second transistor region 102b is provided to be adjacent to the first transistor region 101a in a second direction. In addition, the second transistor region 102c is provided to be adjacent to the first transistor region 101a in a third direction.

An angle ($\theta$ in FIG. 11) between a first side (S1 in FIG. 11) of the first transistor region 101a (first region) on a side opposing the second transistor region 102a (second region) and a second side (52 in FIG. 11) of the first transistor region 101a on a side opposing the second transistor region 102b (third region) is smaller than 90 degrees.

The first direction and the second direction cross each other. For examples, the first direction and the second direction are not orthogonal to each other. The third direction is different from the first direction and the second direction. The first direction and the third direction are not orthogonal to each other.

In the bidirectional switching device 300, each of the first transistor region and the second transistor region has a trapezoidal shape. Further, the first transistor region and the second transistor region are disposed such that the longest side of the trapezoidal shape, that is, oblique sides oppose each other.

Therefore, a length of a boundary region between the first transistor region and the second transistor region is longer than that in the bidirectional switching device 100 of the first embodiment. Accordingly, an on-current of the bidirectional switching device 300 is larger than the on-current of the bidirectional switching device 100 of the first embodiment.

Figure 12:
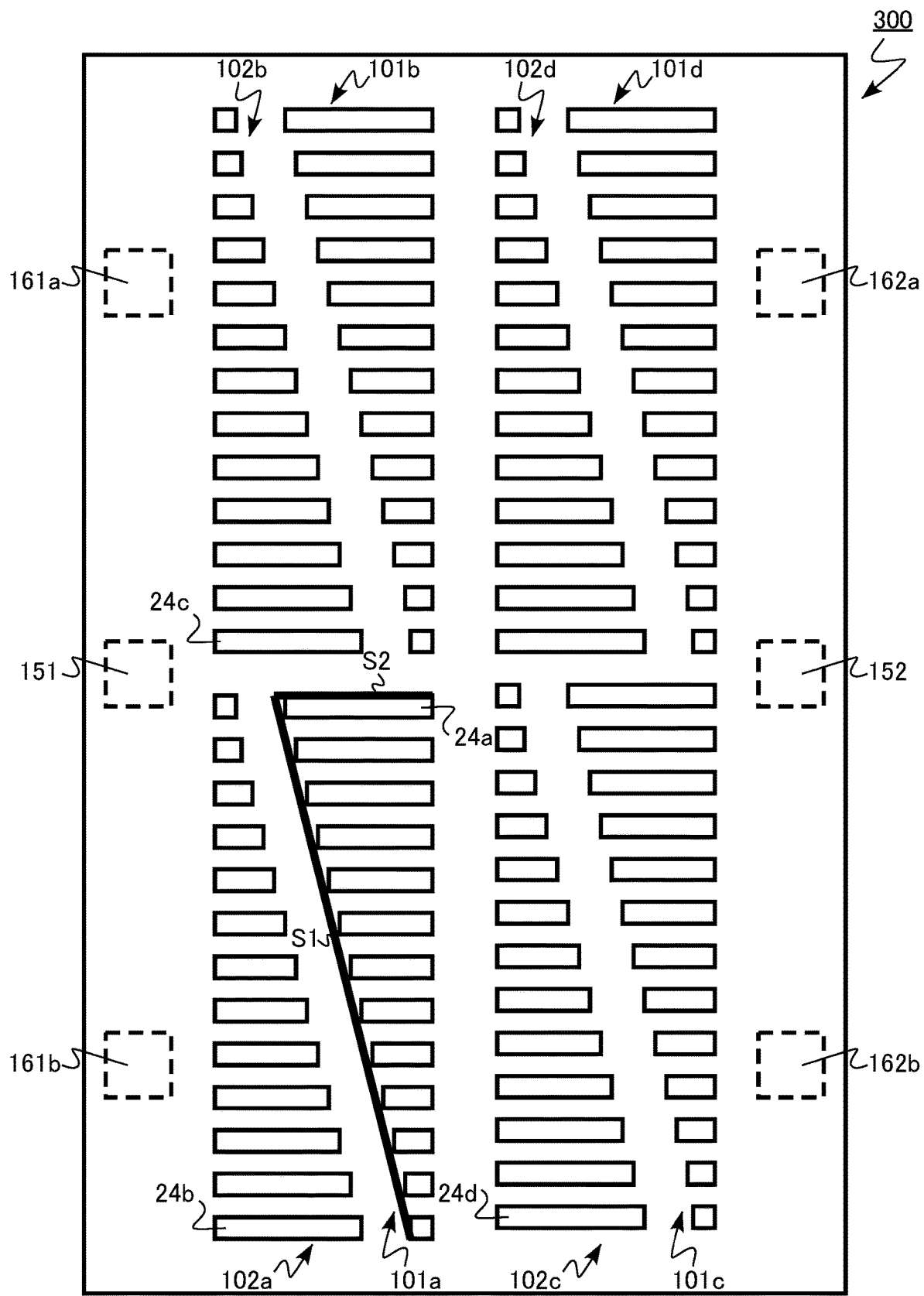
FIG. 12 is a layout diagram of the semiconductor device according to the third embodiment.

FIG. 12 is a layout diagram of the semiconductor device according to the third embodiment. FIG. 12 illustrates a pattern layout of trenches provided in the bidirectional switching device 300.

FIG. 12 also illustrates positions of a first gate electrode pad 151, a second gate electrode pad 152, a first source electrode pad 161a, a first source electrode pad 161b, a second source electrode pad 162a, and a second source electrode pad 162b.

An extending direction of a trench in each transistor region is parallel to a bottom side of a trapezoid of each transistor region and is inclined to the oblique side. For example, an extending direction of a first trench 24a of the first transistor region 101a is parallel to a bottom side of the trapezoid of the first transistor region 101a and is inclined to the oblique side.

An angle formed by a longer side between the first side (S1 in FIG. 12) of the first transistor region 101a (first region) on the side opposing the second transistor region 102a (second region) and the second side (32 in FIG. 12) of the first transistor region 101a on the side opposing the second transistor region 102b (third region) and the extending direction of the first trench 24a is larger than an angle formed by a shorter side between the first side and the second side and the extending direction of the first trench 24a. The angle formed by the first side S1, which is the longer side, and the extending direction of the first trench 24a is larger than 0 degree, and the angle formed by the second side S2, which is the shorter side, and the extending direction of the first trench 24a is 0 degree.

In the bidirectional switching device 300, the first side S1 is longer than the second side S2. Therefore, the length. (Si) of the boundary region in which the current flows along the extending direction of the first trench 24a is longer than the length (S2) of the boundary region in which the current flows in the direction orthogonal to the extending direction of the first trench 24a.

Accordingly, the on-current of the bidirectional switching device 300 increases. In other words, an on-resistance of the bidirectional switching device 300 is reduced.

As described above, it is possible to realize the bidirectional switching device 300 capable of further reducing the on-resistance according to the third embodiment.

Although the case of the n-channel MISFET using electrons as carriers has been described as an example in the first to third embodiments, a p-channel MISFET having holes as carriers can be applied instead of the n-channel MISFET.

In addition, the case where the pattern layout of trenches is a stripe pattern where the trenches extend in one direction has been described as an example in the first embodiment, but the pattern layout of trenches may be a mesh pattern, that is, a so-called honeycomb pattern.

In addition, the case where each of the first transistor region and the second transistor region is divided into three or four portion has been described as as example in the first to third embodiments, but each of the first transistor region and the second transistor region can be divided into five or more portion.

While certain embodiments have been described, these embodiments have been presented by way of example only, and are not intended to limit the scope of the inventions indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first region including a first portion of a semiconductor layer having a first plane and a second plane, a first trench provided in the first portion, a first gate electrode provided in the first trench, a first source electrode provided on a first plane side of the first portion, and a drain electrode provided on a second plane side of the first portion;
   a second region provided to be adjacent to the first region in a first direction and including a second portion of the semiconductor layer, a second trench provided in the second portion, a second gate electrode provided in the second trench, a second source electrode provided on the first plane side of the second portion, and the drain electrode provided on the second plane side of the second portion;
   a third region provided to be adjacent to the first region in a second direction crossing the first direction and including a third portion of the semiconductor layer, a third trench provided in the third portion, a third gate electrode provided in the third trench, a third source electrode provided on the first plane side of the third portion, and the drain electrode provided on the second plane side of the third portion;
   a first gate electrode pad electrically connected to the first gate electrode; and
   a second gate electrode pad electrically connected to the second gate electrode and the third gate electrode,
   wherein a first side of the first region opposing the second region has a first length and a second side of the first region opposing the third region has a second length different from the first length.

2. The semiconductor device according to claim 1, wherein the first direction and the second direction are orthogonal to each other.

3. The semiconductor device according to claim 1, wherein
   the first side is parallel to the extending direction of the first trench.

4. The semiconductor device according to claim 3, wherein the first length is longer than the second length.

5. The semiconductor device according to claim 1, wherein the second source electrode and the third source electrode are electrically connected.

6. The semiconductor device according to claim 1, further comprising
   a fourth portion provided to be adjacent to the first region in a third direction different from the first direction and the second direction and including a fourth portion of the semiconductor layer, a fourth trench provided in the fourth portion, a fourth gate electrode provided in the fourth trench, a fourth source electrode in contact with the first plane of the fourth portion, and the drain electrode provided on the second plane side of the fourth portion.

7. The semiconductor device according to claim 6, wherein the first direction and the second direction are orthogonal to each other, and the first direction and the third direction are orthogonal to each other.

8. The semiconductor device according to claim 6, wherein the second source electrode, the third source electrode, and the fourth source electrode are electrically connected.

9. The semiconductor device according to claim 1, wherein
   the second side is parallel to the extending direction of the first trench.

10. The semiconductor device according to claim 9, wherein the first length is longer than the second length.

11. The semiconductor device according to claim 1, wherein the semiconductor layer is silicon.

12. A semiconductor device comprising:
- a first region including a first portion of a semiconductor layer having a first plane and a second plane, a first trench provided in the first portion, a first gate electrode provided in the first trench, a first source electrode provided on a first plane side of the first portion, and a drain electrode provided on a second plane side of the first portion;
- a second region provided to be adjacent to the first region in a first direction and including a second portion of the semiconductor layer, a second trench provided in the second portion, a second gate electrode provided in the second trench, a second source electrode provided on the first plane side of the second portion, and the drain electrode provided on the second plane side of the second portion;
- a third region provided to be adjacent to the first region in a second direction crossing the first direction and including a third portion of the semiconductor layer, a third trench provided in the third portion, a third gate electrode provided in the third trench, a third source electrode provided on the first plane side of the third portion, and the drain electrode provided on the second plane side of the third portion;
- a first gate electrode pad electrically connected to the first gate electrode; and
- a second gate electrode pad electrically connected to the second gate electrode and the third gate electrode,
- wherein an angle between a first side of the first region opposing the second region and a second side of the first region opposing the third region is smaller than 90 degrees.

* * * * *